(12) United States Patent
Cheon et al.

(10) Patent No.: US 7,764,562 B2
(45) Date of Patent: Jul. 27, 2010

(54) SEMICONDUCTOR MEMORY DEVICE HAVING A SHORT RESET TIME

(75) Inventors: Kwun-Soo Cheon, Suwon-si (KR); Byong-Wook Na, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 237 days.

(21) Appl. No.: 12/012,244

(22) Filed: Feb. 1, 2008

(65) Prior Publication Data
US 2008/0186792 A1 Aug. 7, 2008

(30) Foreign Application Priority Data
Feb. 7, 2007 (KR) ...................... 10-2007-0012681

(51) Int. Cl.
*G11C 7/00* (2006.01)
(52) U.S. Cl. ...................... 365/226; 365/227; 365/228; 365/230.03; 365/185.03
(58) Field of Classification Search ................ 365/226, 365/185.03, 230.03, 227, 228, 225.7
See application file for complete search history.

(56) References Cited
U.S. PATENT DOCUMENTS

| 4,984,215 | A | | 1/1991 | Ushida |
| 5,365,481 | A | * | 11/1994 | Sawada ....................... 365/201 |
| 6,088,281 | A | * | 7/2000 | Miyakawa et al. ....... 365/225.7 |
| 6,639,854 | B2 | | 10/2003 | Hur et al. |
| 2006/0139985 | A1 | * | 6/2006 | Kanda et al. .................. 365/94 |
| 2009/0175077 | A1 | * | 7/2009 | Takase et al. .......... 365/185.03 |

FOREIGN PATENT DOCUMENTS

| JP | 61-153895 | 7/1986 |
| JP | 02-015494 | 1/1990 |
| JP | 02-113489 | 4/1990 |
| KR | 20020089988 A | 11/2002 |

* cited by examiner

*Primary Examiner*—Connie C Yoha
(74) *Attorney, Agent, or Firm*—Mills & Onello, LLP (57) ABSTRACT

A semiconductor memory device includes a row path circuit, a reset signal generating circuit and a column path circuit. The row path circuit is initialized in response to a power-up signal. The reset signal generating circuit delays the power-up signal to generate a column reset signal. The column path circuit is initialized in response to the column reset signal. The semiconductor memory device can reduce a peak value of a surge current by initializing a row path circuit and a column path circuit at different time points. Therefore, the semiconductor memory device may have a relatively short setup time of an internal power supply voltage.

22 Claims, 9 Drawing Sheets

SEMICONDUCTOR MEMORY DEVICE HAVING A SHORT RESET TIME

CROSS-REFERENCE TO RELATED APPLICATIONS

This application claims priority under 35 USC §119 to Korean Patent Application No. 10-2007-0012681, filed on Feb. 7, 2007 in the Korean Intellectual Property Office (KIPO), the disclosure of which is incorporated herein in its entirety by reference.

BACKGROUND OF THE INVENTION

1. Field of the Invention

Embodiments of the present invention relate a semiconductor memory device, and more particularly to a semiconductor memory device having a short setup time of an internal power supply voltage and a method of initializing a semiconductor memory device.

2. Description of the Related Art

A semiconductor memory device stores data in memory cells and outputs data stored in the memory cells to an external circuit. Word lines coupled to the memory cells are activated to read data from the memory cells or to write data to the memory cells. The word lines are enabled in response to an active command and disabled in response to a precharge command.

The semiconductor memory device includes internal logic circuits, such as a latch circuit, etc. The logic circuits have to be initialized before the semiconductor memory device performs normal operations. A conventional semiconductor memory device resets the logic circuits in response to a power-up signal.

When initialization of the logic circuits is completed, a surge current may be unfortunately generated in response to a transition of the power-up signal. The surge current can operate to delay a setup time of an internal power supply voltage for operating the semiconductor memory device, which can adversely affect device performance.

SUMMARY OF THE INVENTION

Accordingly, embodiments of the present invention substantially obviate one or more problems due to limitations and disadvantages of the related art. In particular, a semiconductor memory device having a short setup time of an internal power supply voltage, and related method, are provided.

Some example embodiments of the present invention provide a semiconductor memory device having a short setup time of an internal power supply voltage by initializing a row path circuit and a column path circuit at different time points.

Some example embodiments of the present invention provide a method of initializing a semiconductor memory device in a short setup time by initializing a row path circuit and a column path circuit at different time points.

In some example embodiments of the present invention, a semiconductor memory device includes a row path circuit, a reset signal generating circuit and a column path circuit. The row path circuit is configured to decode a row address signal to provide a word line enable signal to a memory cell array and is configured to be initialized in response to a power-up signal. The reset signal generating circuit is configured to delay the power-up signal to generate a column reset signal. The column path circuit is configured to decode a column address signal to provide a column selection signal to the memory cell array and is configured to be initialized in response to the column reset signal.

The row path circuit and the column path circuit may be initialized at different time points. The row path circuit may be initialized in a power-up region and the column path circuit may be initialized in a mode setting region of the device. Alternatively, the row path circuit may be initialized in a power-up region and the column path circuit may be initialized in an auto refresh region of the device.

The reset signal generating circuit may includes a pulse generator configured to generate a control pulse in response to a command signal and a switching circuit configured to transfer the power-up signal to a first node in response to the control pulse. The command signal may include a chip selection signal, a row address strobe signal, a column address strobe signal and a write enable signal. The reset signal generating circuit may further include an inverter configured to invert the power-up signal and a transistor configured to provide a reference voltage to the first node in response to an output signal of the inverter. The reset signal generating circuit may further include a latch circuit configured to latch a voltage signal of the first node to output the column reset signal.

In some embodiments, the pulse generator may include a NOR logic unit configured to perform an NOR operation on a chip selection signal, a row address strobe signal, a column address strobe signal and a write enable signal, a delay circuit configured to delay a first output signal of the NOR logic unit such that the control pulse has a pulse width corresponding to a delay time generated by the delay circuit and an AND logic unit configured to perform an AND operation on the first output signal and a second output signal of the delay circuit to output the control pulse. The pulse generator may be configured to generate the control pulse in a mode setting region of the device. The pulse generator may be configured to generate the control pulse when the chip selection signal, the row address strobe signal, the column address strobe signal and the write enable signal are enabled. The control pulse may have a pulse width corresponding to a delay time generated by the delay circuit.

In other embodiments, the pulse generator may include an inverter configured to invert a write enable signal, a NOR logic unit configured to perform an NOR operation on a chip selection signal, a row address strobe signal, a column address strobe signal and a first output signal of the inverter, a delay circuit configured to delay a second output signal of the NOR logic unit such that the control pulse has a pulse width corresponding to a delay time generated by the delay circuit and an AND logic unit configured to perform an AND operation on the second output signal and a third output signal of the delay circuit to output the control pulse. The pulse generator may be configured to generate the control pulse in an auto refresh region. The pulse generator may be configured to generate the control pulse when the chip selection signal, the row address strobe signal and the column address strobe signal are enabled and the write enable signal is disabled. The control pulse may have a pulse width corresponding to a delay time generated by the delay circuit.

The reset signal generating circuit may include a switching circuit configured to transfer the power-up signal to a first node in response to a control pulse, a latch circuit configured to latch a voltage signal of the first node, a first inverter configured to invert an output signal of the latch circuit to output the column reset signal and a pulse generator configured to generate the control pulse in response to a command signal and the column reset signal. The command signal may include a chip selection signal, a row address strobe signal, a column address strobe signal and a write enable signal. The reset signal generating circuit may further include an inverter configured to invert the power-up signal and a transistor configured to provide a reference voltage to the first node in response to an output signal of the inverter.

In some embodiments, the pulse generator may include a NOR logic unit configured to perform an NOR operation on a chip selection signal, a row address strobe signal, a column address strobe signal and a write enable signal, a delay circuit configured to delay a first output signal of the NOR logic unit such that the control pulse has a pulse width corresponding to a delay time generated by the delay circuit and an AND logic unit configured to perform an AND operation on the first output signal and a second output signal of the delay circuit to output the control pulse. The pulse generator may be configured to generate the control pulse in a mode setting region of the device. The pulse generator may be configured to generate the control pulse when the chip selection signal, the row address strobe signal, the column address strobe signal and the write enable signal are enabled. The control pulse may have a pulse width corresponding to a delay time generated by the delay circuit.

In other embodiments, the pulse generator may include an inverter configured to invert a write enable signal, a NOR logic unit configured to perform an NOR operation on a chip selection signal, a row address strobe signal, a column address strobe signal and a first output signal of the inverter, a delay circuit configured to delay a second output signal of the NOR logic unit such that the control pulse has a pulse width corresponding to a delay time generated by the delay circuit and an AND logic unit configured to perform an AND operation on the second output signal and a third output signal of the delay circuit to output the control pulse. The pulse generator may be configured to generate the control pulse in an auto refresh region. The pulse generator may be configured to generate the control pulse when the chip selection signal, the row address strobe signal and the column address strobe signal are enabled and the write enable signal is disabled. The control pulse may have a pulse width corresponding to a delay time generated by the delay circuit.

In further embodiments, the semiconductor memory device may further include an address input buffer configured to generate the row address signal and the column address signal in response to an external address signal and a power-up circuit configured to generate the power-up signal based on an external power supply voltage. The row path circuit may include a row decoder and the column path circuit may include a column decoder.

In a method of initializing a semiconductor memory device according to some example embodiments of the present invention, a row path circuit is initialized in response to a power-up signal, a column reset signal is generated by delaying the power-up signal, and a column path circuit is initialized in response to the column reset signal. In a step of generating the column reset signal, a control pulse may be generated in response to a command signal and the column reset signal may be output in response to the control pulse.

Therefore, the semiconductor memory device and method of initializing thereof, according to some example embodiments of the present invention may reduce a peak value of a surge current by initializing a row path circuit and a column path circuit at different time points.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EMBODIMENTS

Embodiments of the present invention will now be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
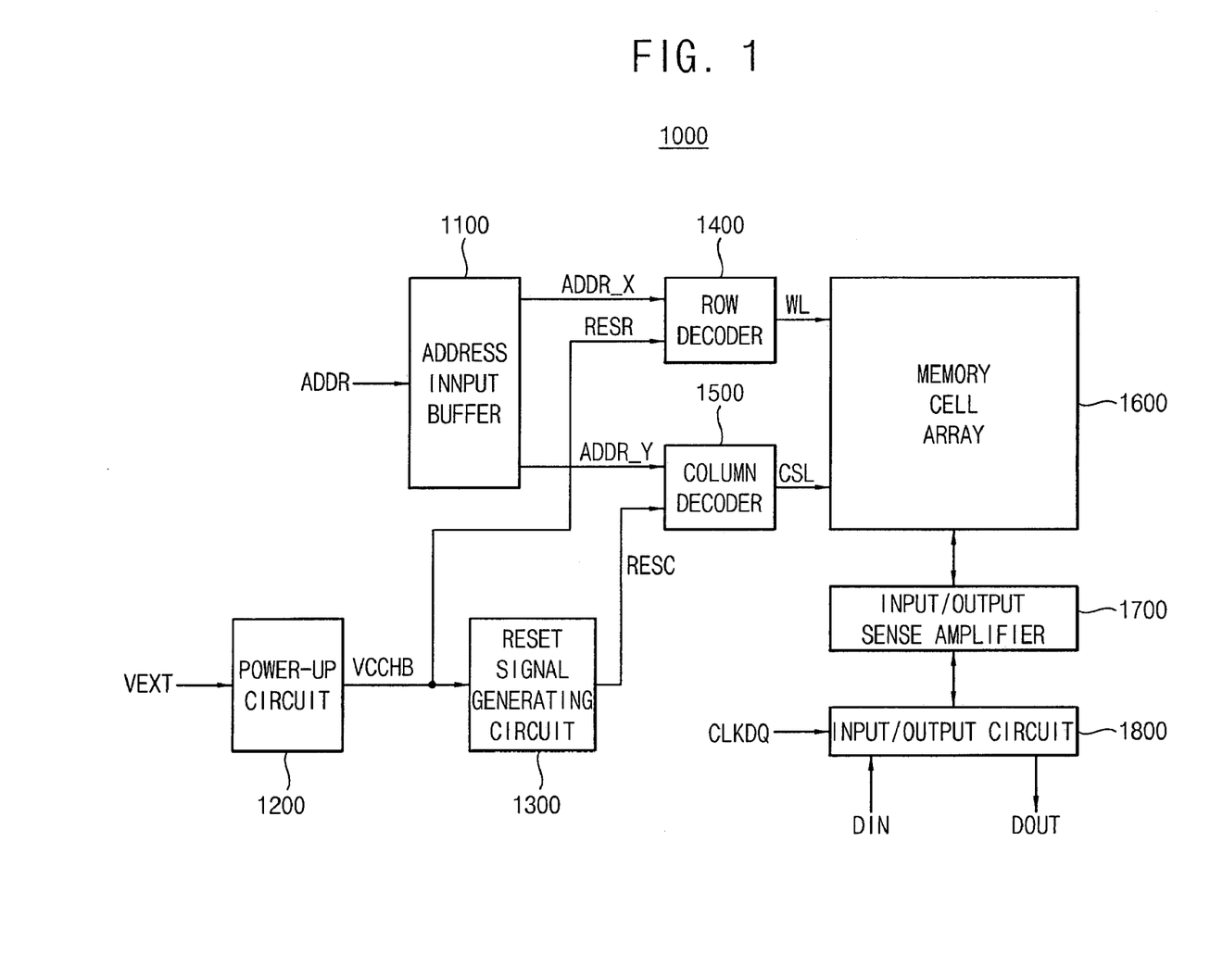
FIG. 1 is a block diagram illustrating a semiconductor memory device according to some example embodiments of the present invention.

FIG. 1 is a block diagram illustrating a semiconductor memory device according to some example embodiments of the present invention.

Referring to FIG. 1, the semiconductor memory device 1000 includes an address input buffer 1100, a power-up circuit 1200, a reset signal generating circuit 1300, a row decoder 1400, a column decoder 1500 and a memory cell array 1600.

The address input buffer 1100 generates a row address signal ADDR_X and a column address signal ADDR_Y in response to an external address signal ADDR. The power-up circuit 1200 generates a power-up signal VCCHB based on an external power supply voltage VEXT. The reset signal generating circuit 1300 generates a column reset signal RESC in response to the power-up signal VCCHB. The row decoder 1400 is initialized in response to a row reset signal RESR. The row decoder 1400 decodes the row reset signal RESR to generate a word line enable signal WL. The row decoder 1400 provides the memory cell array 1600 with the word line enable signal WL. The row reset signal RESR may be substantially the same as the power-up signal VCCHB. The column decoder 1500 is initialized in response to a column reset signal RESC. The column decoder 1500 decodes the column reset signal RESC to generate a column selection signal CSL. The column decoder 1500 provides the memory cell array 1600 with the column selection signal CSL.

The semiconductor memory device 1000 may further include an input/output sense amplifier 1700 and an input/output circuit 1800. The input/output sense amplifier 1700 may amplify data outputted from the memory cell array 1600 and transfer data DIN inputted from an external circuit to the memory cell array 1600. The input/output circuit 1800 receives the data DIN inputted from the external circuit. The input/output circuit is 1800 receives and buffers the data outputted from the memory cell array 1600 to generate output data DOUT in response to an output clock CLKDQ.

Figure 2:
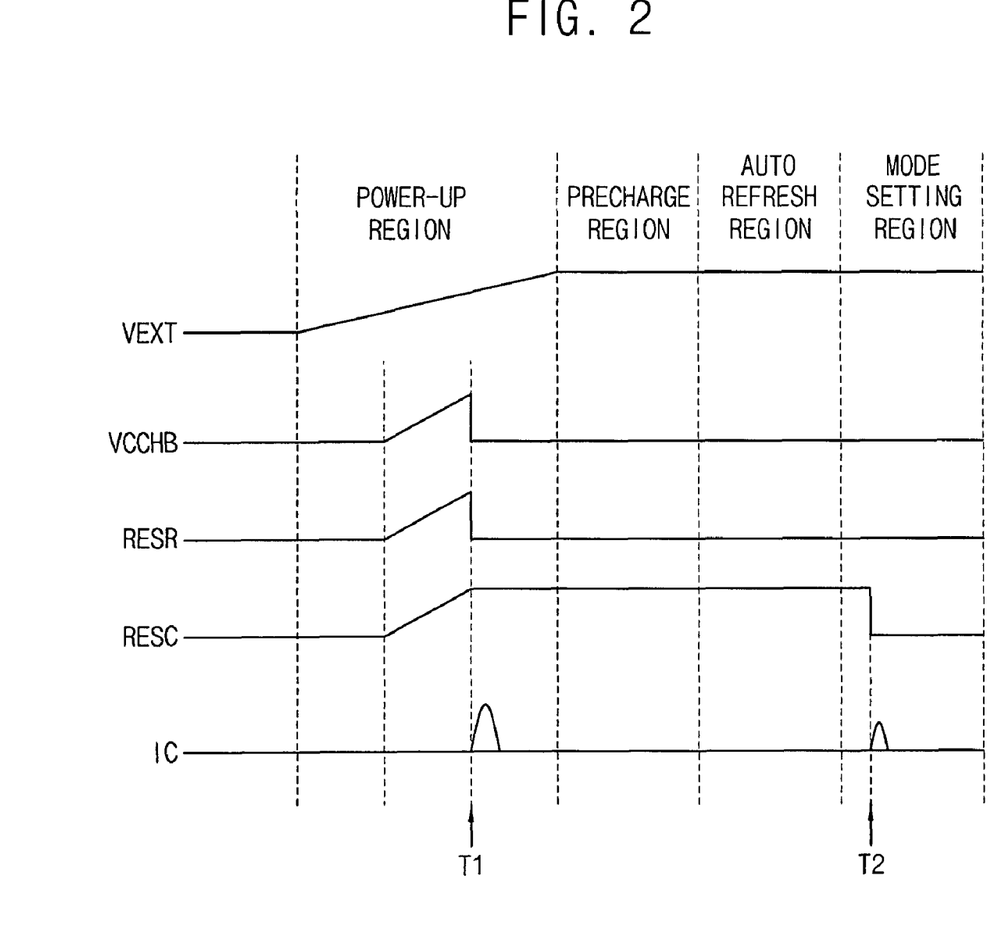
FIG. 2 is a timing diagram illustrating an example embodiment of an initialization process of the semiconductor memory device of FIG. 1.
Figure 3:
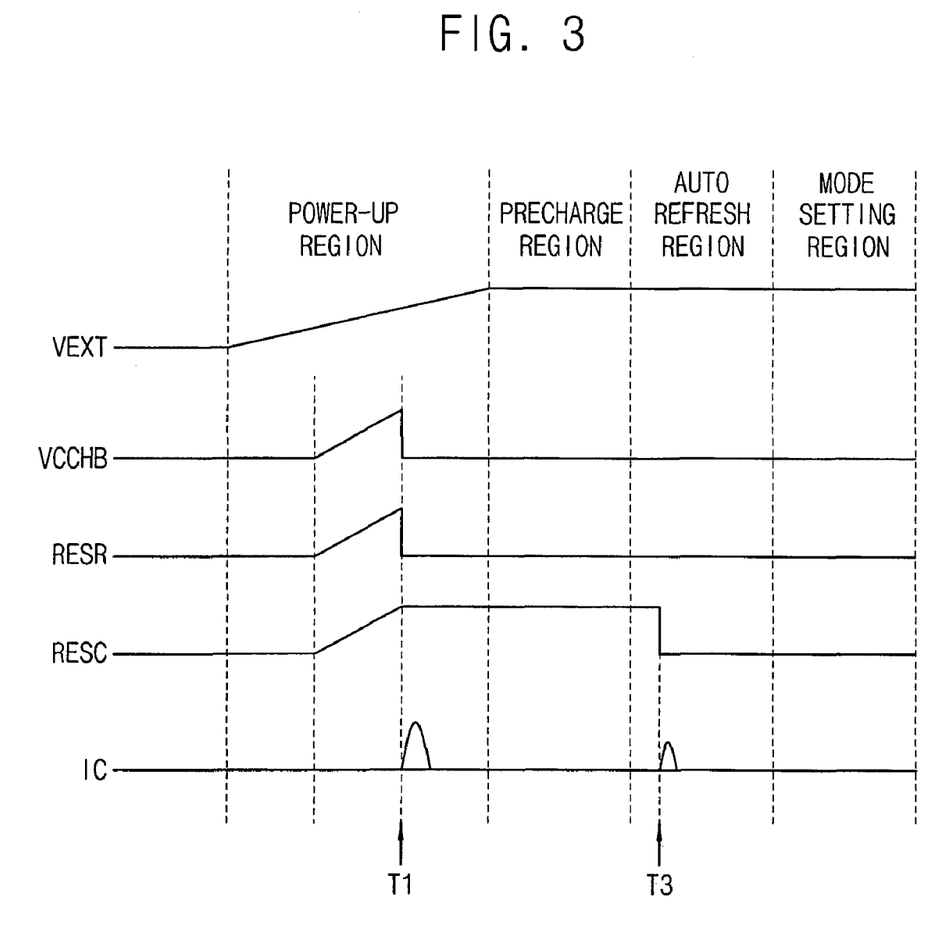
FIG. 3 is a timing diagram illustrating another example embodiment of an initialization process of the semiconductor memory device of FIG. 1.

FIG. 2 is a timing diagram illustrating an example embodiment of an initialization process of the semiconductor memory device of FIG. 1, and FIG. 3 is a timing diagram illustrating another example embodiment of an initialization process of the semiconductor memory device of FIG. 1.

In FIGS. 2 and 3, VEXT represents an external power supply voltage, VCCHB represents a power-up signal, RESR represents a row reset signal, RESC represents a column reset signal and IC represents a current flowing to the semiconductor memory device. Operation modes of the semiconductor memory device 1000 may be respectively represented as timing regions, including: POWER-UP REGION, PRE-CHARGE REGION, AUTO REFRESH REGION, and MODE SETTING REGION.

Hereinafter, the operation of the semiconductor memory device 1000 according to some example embodiments of the present invention will be described with reference to FIGS. 1 through 3.

As illustrated in FIG. 1, an initialization time point for a row path circuit including a row decoder 1400 is different from an initialization time point for a column path circuit including a column decoder 1500. The row decoder 1400 is initialized in response to a power-up signal VCCHB and the column decoder 1500 is initialized in response to a column reset signal RESC that is delayed from the power-up signal VCCHB by a designated delay time.

In a conventional semiconductor memory device as described above, a row path circuit and a column path circuit are simultaneously initialized in response to a power up signal VCCHB. Since the row path circuit and the column path circuit are simultaneously initialized, a large surge current is unfortunately generated during the initialization, and thus a setup time of an internal power supply voltage increases.

In the semiconductor memory device 1000 according to some example embodiments of the present invention, the row path circuit is initialized in response to the power-up signal VCCHB and the column path circuit is initialized in response to the column reset signal RESC that is delayed from the power-up signal VCCHB by the designated delay time. Therefore, in the semiconductor memory device 1000, a peak value of a surge current is low, and thus a setup time of an internal power supply voltage can be relatively short.

Referring to FIGS. 1 and 2, when the external power supply voltage VEXT reaches a predetermined voltage level, or value, the power-up signal VCCHB may be generated. The power-up signal VCCHB may be disabled at a first time point T1. The row reset signal RESR may be disabled at the first time point T1 in response to the power-up signal VCCHB. Unlike the row reset signal RESR, the column reset signal RESC may be disabled at a second time point T2 that is delayed with respect to the first time point T1. The row path circuit including the row decoder 1400 may be initialized at the first time point T1 when the row reset signal RESR is disabled and the column path circuit including the column decoder 1500 may be initialized at the second time point T2 when the column reset signal RESC is disabled. Surge currents may be generated at the first time point T1 and at the second time point T2, respectively. In the initialization process illustrated in FIG. 2, the row reset signal RESR may be disabled in the power-up region and the column reset signal RESC may be disabled in the mode setting region.

Referring to FIGS. 1 and 3, when the external power supply voltage VEXT reaches a predetermined voltage level, the power-up signal VCCHB may be generated. The power-up signal VCCHB may be disabled at a first time point T1. The row reset signal RESR may be disabled at the first time point T1 in response to the power-up signal VCCHB. Unlike the row reset signal RESR, the column reset signal RESC may be disabled at a third time point T3 that is delayed with respect to the first time point T1. The row path circuit including the row decoder 1400 may be initialized at the first time point T1 when the row reset signal RESR is disabled and the column path circuit including the column decoder 1500 may be initialized at the third time point T3 when the column reset signal RESC is disabled. Surge currents may be generated at the first time point T1 and at the third time point T3, respectively. In the initialization process illustrated in FIG. 3, the row reset signal RESR may be disabled in the power-up region and the column reset signal RESC may be disabled in the auto refresh region.

The surge currents generated in the semiconductor memory device 1000 of FIG. 1 have relatively low peak values since the row path circuit and the column path circuit are initialized at different time points. Therefore, in the semiconductor memory device 1000 illustrated in FIG. 1, the setup time of the internal power supply voltage can be relatively short since the surge currents have low peak values.

Figure 4:
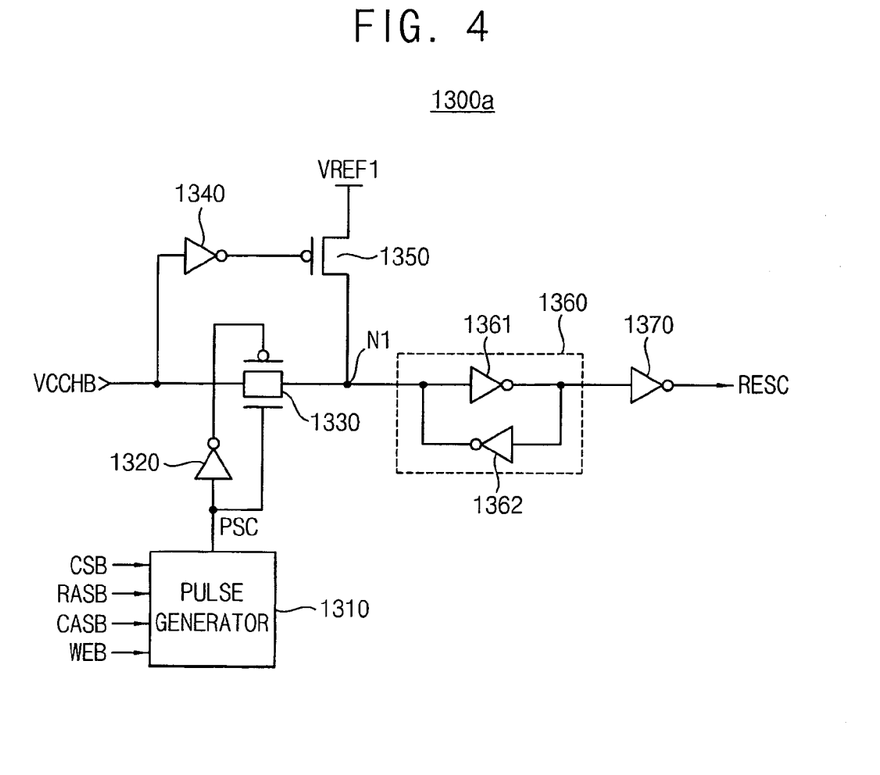
FIG. 4 is a circuit diagram illustrating an example of a reset signal generating circuit included in the semiconductor memory device of FIG. 1.

FIG. 4 is a circuit diagram illustrating an example of the reset signal generating circuit 1300 included in the semiconductor memory device 1000 of FIG. 1.

Referring to FIG. 4, a reset signal generating circuit 1300a includes a pulse generator 1310, a first inverter 1320, a transfer gate 1330, a second inverter 1340, a P-channel Metal Oxide Semiconductor (PMOS) transistor 1350, a latch circuit 1360 and a third inverter 1370. The latch circuit 1360 may include inverters 1361 and 1362.

The pulse generator 1310 may generate a control pulse PSC in response to command signals CSB, RASB, CASB and WEB. CSB represents a chip selection signal, RASB represents a row address strobe signal, CASB represents a column address strobe signal and WEB represents a write enable signal. The command signals CSB, RASB, CASB and WEB may be enabled at logic '0' state, respectively. The first inverter 1320 inverts a logic state of the control pulse PSC. The transfer gate 1330 transfers a power-up signal VCCHB to a first node N1 in response to the control pulse PSC and an output signal of the first inverter 1320. The second inverter 1340 inverts a logic state of the power-up signal VCCHB. The PMOS transistor 1350 supplies a reference voltage VREF1 to the first node N1 in response to an output signal of the second inverter 1340. The reference voltage VREF1 may be an internal power supply voltage of a semiconductor memory device, which is a power supply voltage internally used in the semiconductor memory device. The latch circuit 1360 latches a voltage signal of the first node N1. The third inverter 1370 inverts a logic state of an output signal of the latch circuit 1360 to generate a column reset signal RESC.

Hereinafter, operations of the reset signal generating circuit 1300a will be described with reference to FIG. 4.

The pulse generator 1310 may generate the control pulse PSC in response to the chip selection signal CSB, the row address strobe signal RASB, the column address strobe signal CASB and the write enable signal WEB. An operation mode of a semiconductor memory device is determined based on a combination of the chip selection signal CSB, the row address strobe signal RASB, the column address strobe signal CASB and the write enable signal WEB. For example, when the chip selection signal CSB is at logic '0' state, the row address strobe signal RASB is at logic '0' state, the column address strobe signal CASB is at logic '1' state and the write enable signal WEB is at logic '0' state, the operation mode may be a precharge region. When the chip selection signal CSB is at logic '0' state, the row address strobe signal RASB is at logic '0' state, the column address strobe signal CASB is at logic '0' state and the write enable signal WEB is at logic '1' state, the operation mode may be an auto refresh region. When the chip selection signal CSB is at logic '0' state, the row address strobe signal RASB is at logic '0' state, the column address strobe signal CASB is at logic '0' state and the write enable signal WEB is at logic '0' state, the operation mode may be a mode setting region.

The control pulse PSC may be generated in the mode setting region or the auto refresh region. If control pulse PSC is at logic '0' state, the transfer gate 1330 is turned off, and thus the power-up signal VCCHB may not be transferred to the first node N1. If control pulse PSC is at logic '1' state, the transfer gate 1330 is turned on, and thus the power-up signal VCCHB may be transferred to the first node N1.

While the power-up signal VCCHB is transferred to the first node N1, if the power-up signal VCCHB is at logic '0' state, the voltage signal of the first node N1 is at logic '0' state, the output voltage signal of the latch circuit 1360 is at logic '1' state and the column reset signal RESC that is an output voltage signal of the third inverter 1370 is at logic '0' state. The power-up signal VCCHB and the column reset signal RESC may be enabled at logic '0' state, respectively. The PMOS transistor 1350 may be turned off when the power-up signal VCCHB is at logic '0' state and turned on when the power-up signal VCCHB is at logic '1' state. If The PMOS transistor 1350 is turned on, the reference voltage VREF1 may be supplied to the first node N1, and thus a voltage of the first node N1 increases. The second inverter 1340 and the PMOS transistor 1350 are configured to decrease a transition time when the voltage signal of the first node N1 transitions from logic '0' state to logic '1' state.

Figure 5:
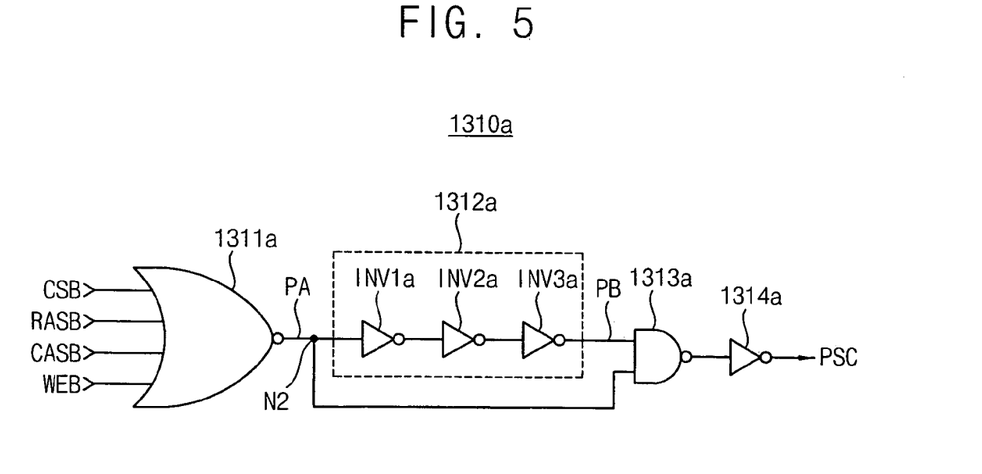
FIG. 5 is a circuit diagram illustrating an example of a pulse generator included in the reset signal generating circuit of FIG. 4.

FIG. 5 is a circuit diagram illustrating an example of the pulse generator 1310 included in the reset signal generating circuit 1300a of FIG. 4.

Referring to FIG. 5, a pulse generator 1310a includes a NOR gate 1311a, a delay circuit 1312a, a NAND gate 1313a and a fourth inverter 1314a. The delay circuit 1312a may include three inverters INV1a, INV2a and INV3a.

The NOR gate 1311a performs a NOR operation on a chip selection signal CSB, a row address strobe signal RASB, a column address strobe signal CASB and a write enable signal WEB. The delay circuit 1312a delays a first output signal PA of the NOR gate 1311a. The NAND gate 1313a performs a NAND operation on a second output signal PB of the delay circuit 1312a and the first output signal PA of the NOR gate 1311a. The fourth inverter 1314a inverts a logic state of an output signal of the NAND gate 1313a to generate a control pulse PSC.

Figure 6:
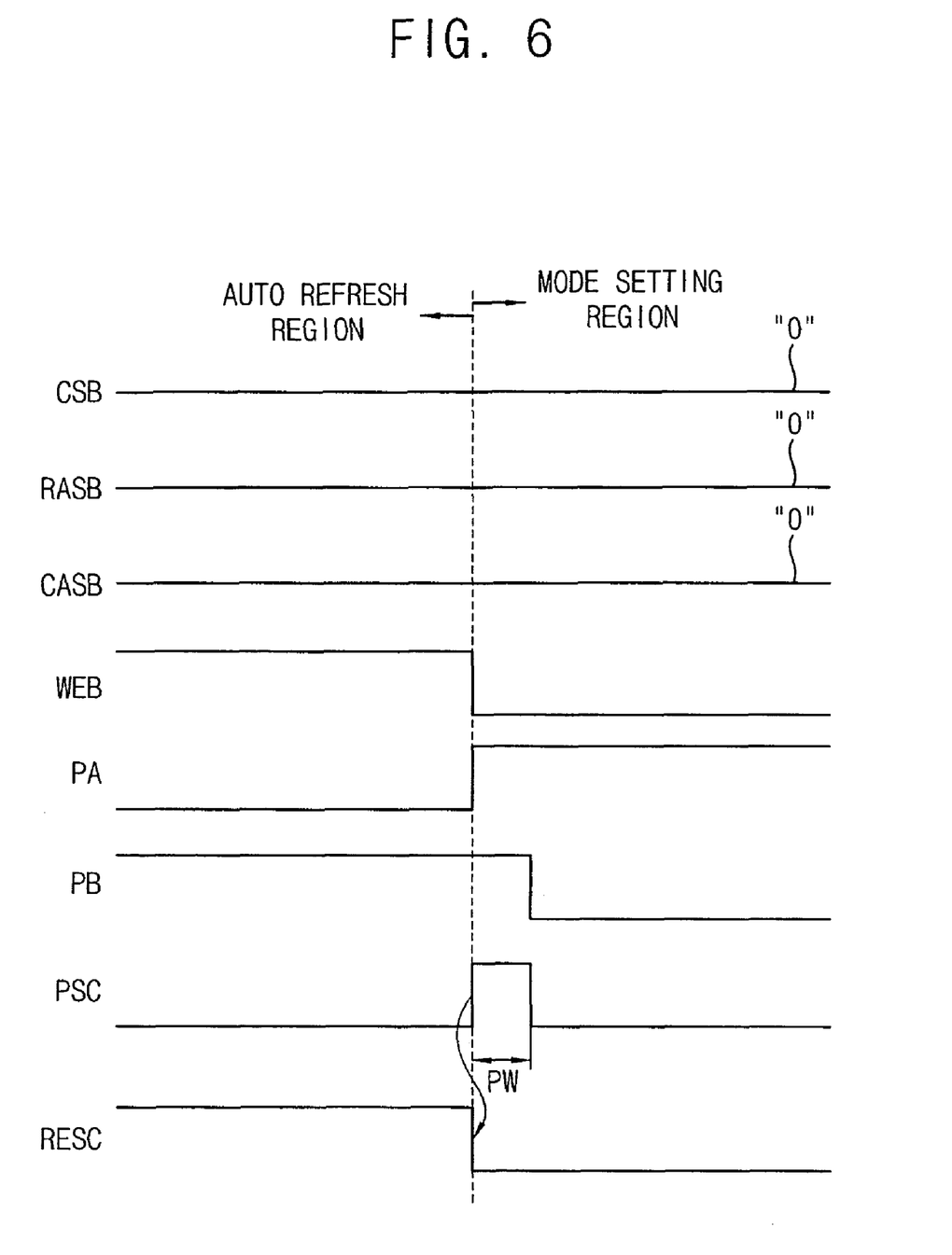
FIG. 6 is a timing diagram illustrating operations of the pulse generator of FIG. 5.

FIG. 6 is a timing diagram illustrating operations of the pulse generator of FIG. 5.

Hereinafter, operations of the pulse generator 1310a will be described with reference to FIGS. 5 and 6.

In an auto refresh region, the chip selection signal CSB is at logic '0' state, the row address strobe signal RASB is at logic '0' state, the column address strobe signal CASB is at logic '0' state and the write enable signal WEB is at logic '1' state. In a mode setting region, the chip selection signal CSB is at logic '0' state, the row address strobe signal RASB is at logic '0' state, the column address strobe signal CASB is at logic '0' state and the write enable signal WEB is at logic '0' state.

The first output signal PA of the NOR gate 1311a, or a voltage signal of a second node N2 may be at logic '0' state in the auto refresh region. The first output signal PA of the NOR gate 1311a may be at logic '1' state in the mode setting region. The second output signal PB of the delay circuit 1312a may be at logic '1' state in the auto refresh region. The second output signal PB of the delay circuit 1312a may transition to logic '0' state when a predetermined delay time generated by the delay circuit 1312a elapses after an operation mode of a semiconductor memory device is changed from the auto refresh region to the mode setting region. The control pulse PSC may be generated in response to the fist output signal PA of the NOR gate 1311a. The control pulse PSC may have a pulse width PW corresponding to the predetermined delay time generated by the delay circuit 1312a. The reset signal generating circuit 1300a of FIG. 4 may delay a power-up signal VCCHB to generate a column reset signal RESC in response to the control pulse PSC.

Figure 7:
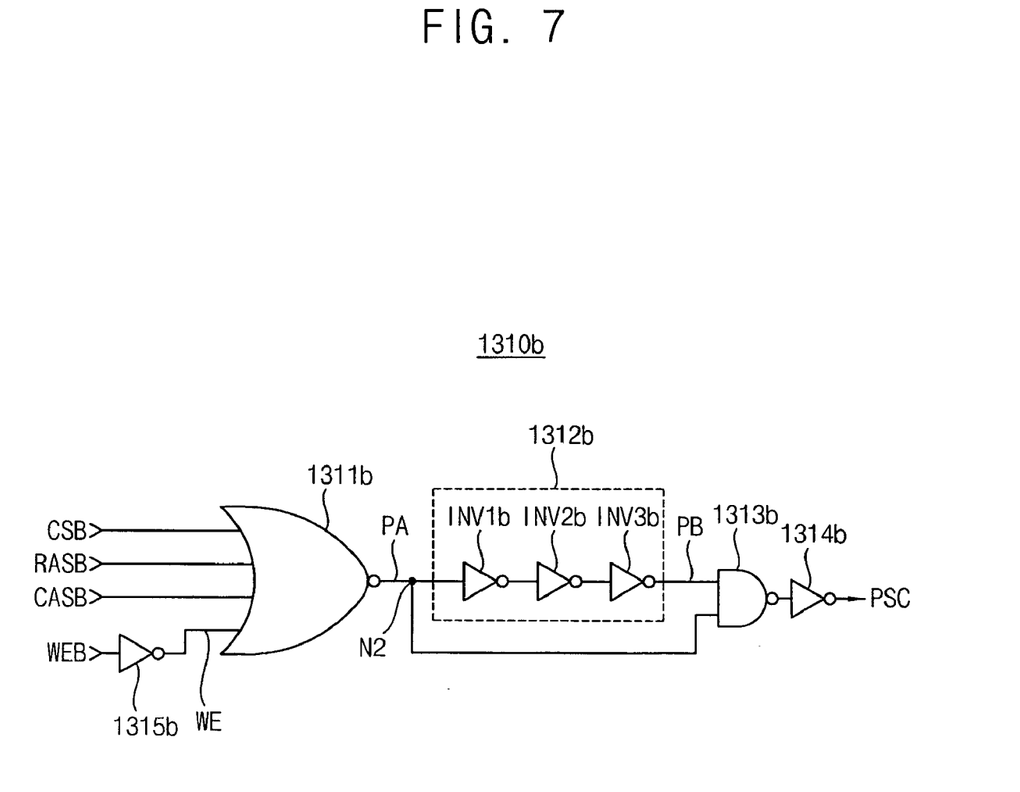
FIG. 7 is a circuit diagram illustrating another example of the pulse generator included in the reset signal generating circuit of FIG. 4.

FIG. 7 is a circuit diagram illustrating another example of the pulse generator 1310 included in the reset signal generating circuit 1300a of FIG. 4.

Referring to FIG. 7, a pulse generator 1310b includes a fifth inverter 1315b, a NOR gate 1311b, a delay circuit 1312b, a NAND gate 1313b and a fourth inverter 1314b. The delay circuit 1312b may include three inverters INV1b, INV2b and INV3b.

The fifth inverter 1315b inverts a logic state of a write enable signal WEB. The NOR gate 1311b performs a NOR operation on a chip selection signal CSB, a row address strobe signal RASB, a column address strobe signal CASB and an output signal of the fifth inverter 1315b. The delay circuit 1312b delays a first output signal PA of the NOR gate 1311b. The NAND gate 1313b performs a NAND operation on a second output signal PB of the delay circuit 1312b and the first output signal PA of the NOR gate 1311b. The fourth inverter 1314b inverts a logic state of an output signal of the NAND gate 1313b to generate a control pulse PSC.

Figure 8:
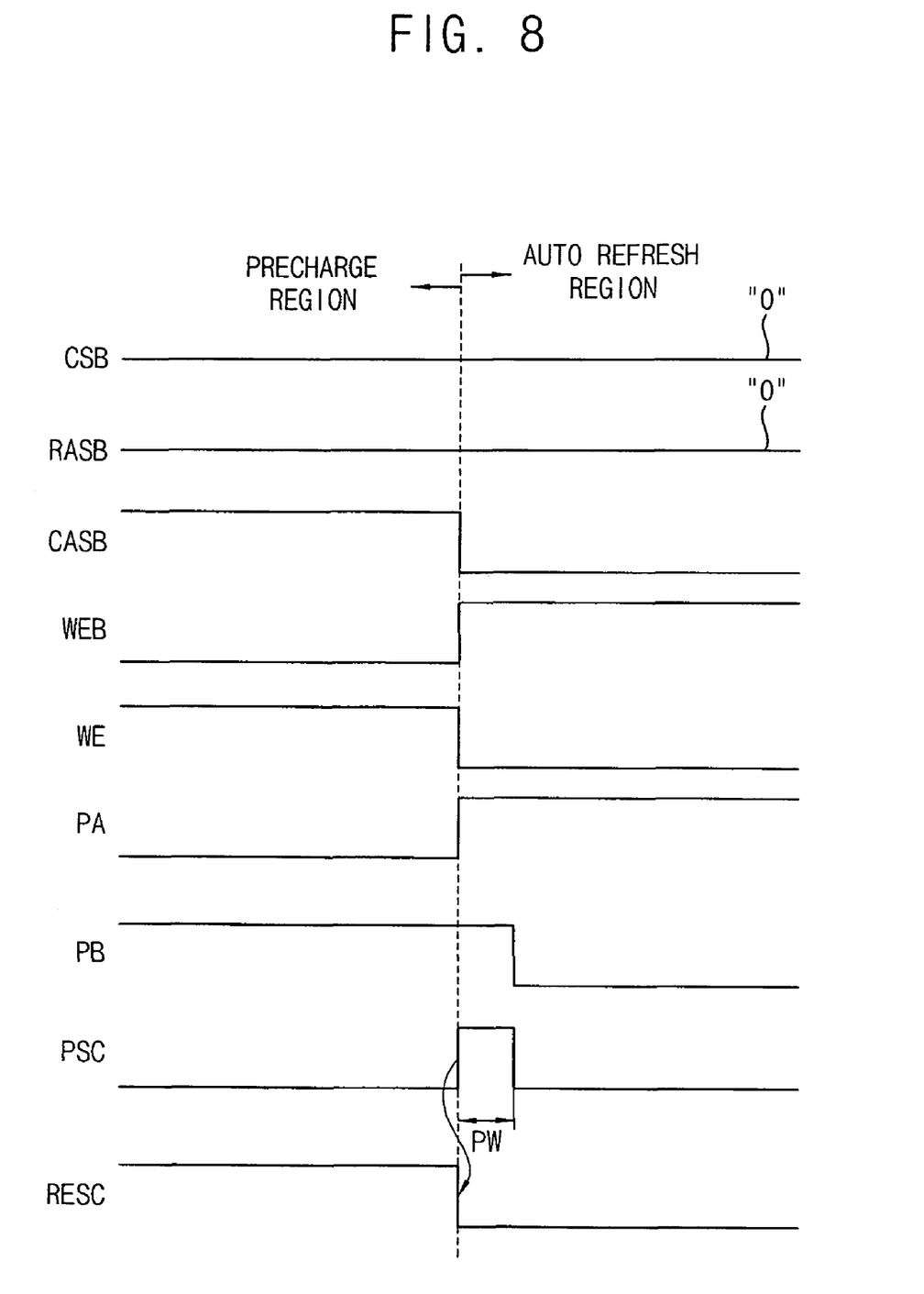
FIG. 8 is a timing diagram illustrating operations of the pulse generator of FIG. 7.

FIG. 8 is a timing diagram illustrating operations of the pulse generator of FIG. 7.

Hereinafter, operations of the pulse generator 1310b will be described with reference to FIGS. 7 and 8.

In a precharge region, a chip selection signal CSB is at logic '0' state, a row address strobe signal RASB is at logic '0' state, a column address strobe signal CASB is at logic '0' state, a write enable signal WEB is at logic '0' state and an output signal WE of a fifth inverter 1315b is at logic '1' state. In an auto refresh region, the chip selection signal CSB is at logic '0' state, the row address strobe signal RASB is at logic '0' state, the column address strobe signal CASB is at logic '0' state and the write enable signal WEB is at logic '1' state and the output signal WE of the fifth inverter 1315b is at logic '0' state.

The first output signal PA of the NOR gate 1311b, or a voltage signal of a second node N2 may be at logic '0' state in the precharge region. The first output signal PA of the NOR gate 1311b may be at logic '1' state in the auto refresh region. The second output signal PB of the delay circuit 1312b may be at logic '1' state in the precharge region. The second output signal PB of the delay circuit 1312b transitions to logic '0' state when a predetermined delay time generated by the delay circuit 1312b elapses after an operation mode of a semiconductor memory device is changed from the precharge region to the auto refresh region. A control pulse PSC may be generated in response to the output signal PA of the NOR gate 1311b. The control pulse PSC may have a pulse width PW corresponding to the predetermined delay time generated by the delay circuit 1312b. The reset signal generating circuit 1300a of FIG. 4 delays a power-up signal VCCHB in response to the control pulse PSC to generate a column reset signal RESC.

Figure 9:
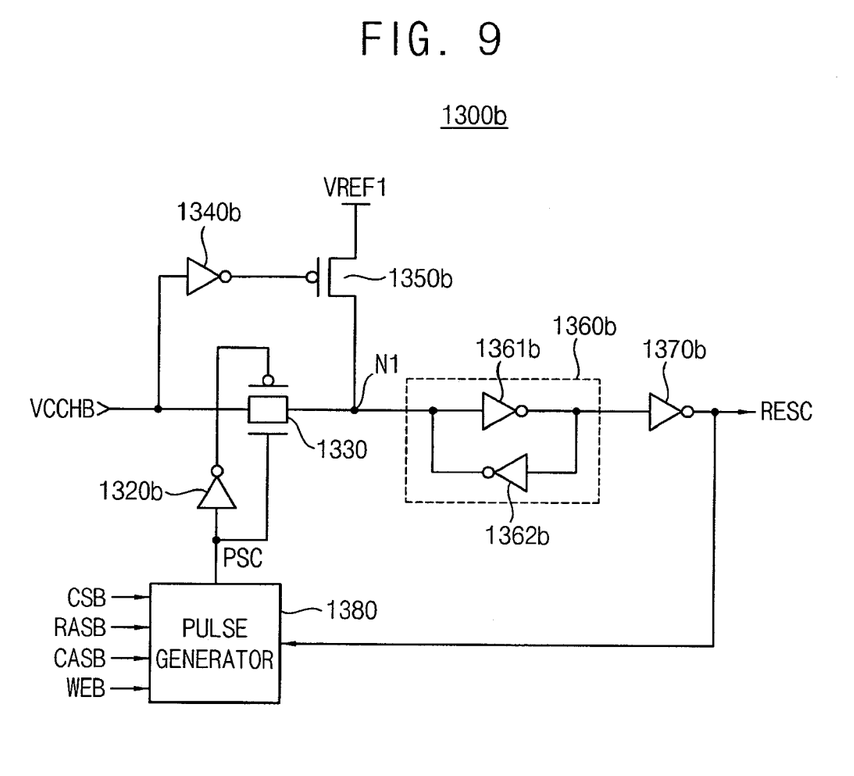
FIG. 9 is a circuit diagram illustrating another example of a reset signal generating circuit included in the semiconductor memory device of FIG. 1.

FIG. 9 is a circuit diagram illustrating another example of the reset signal generating circuit 1300 included in the semiconductor memory device 1000 of FIG. 1.

Referring to FIG. 9, a reset signal generating circuit 1300b includes a pulse generator 1380, a first inverter 1320b, a transfer gate 1330b, a second inverter 1340b, a PMOS transistor 1350b, a latch circuit 1360b and a third inverter 1370b. A column reset signal RESC that is an output signal of the third inverter 1370b is input to the pulse generator 1380. The latch circuit 1360b may include inverters 1361b and 1362b.

The pulse generator 1380 can generate a control pulse PSC in response to command signals CSB, RASB, CASB and WEB and the column reset signal RESC. The first inverter 1320b inverts a logic state of the control pulse PSC. The transfer gate 1330b transfers a power-up signal VCCHB to a first node N1 in response to the control pulse PSC and an output signal of the first inverter 1320b. The second inverter 1340b inverts a logic state of the power-up signal VCCHB. The PMOS transistor 1350b supplies a reference voltage VREF1 to the first node N1 in response to an output signal of the second inverter 1340b. The reference voltage VREF1 may be an internal power supply voltage of a semiconductor memory device, which is a power supply voltage internally used in the semiconductor memory device. The latch circuit 1360b latches a voltage signal of the first node N1. The third inverter 1370b inverts a logic state of an output signal of the latch circuit 1360b to generate a column reset signal RESC.

Hereinafter, operations of the reset signal generating circuit 1300b will be described with reference to FIG. 9.

The pulse generator 1380 may generate the control pulse PSC in response to the chip selection signal CSB, the row address strobe signal RASB, the column address strobe signal CASB, the write enable signal WEB and the column reset signal RESC. In the initialization process of the semiconductor memory device illustrated in FIG. 2, the column reset signal RESC is enabled at the second time point T2 and the column path circuit including the column decoder may be initialized at the second time point T2. In the initialization process of the semiconductor memory device illustrated in FIG. 3, the column reset signal RESC is enabled at the third time point T3 and the column path circuit including the column decoder may be initialized at the third time point T3.

In the reset signal generating circuit 1300b of FIG. 9, the control pulse PSC may transition to a logic '0' state when the column reset signal RESC transitions to a logic '0' state. In other words, the control pulse PSC may be disabled while the column reset signal RESC is enabled.

The control pulse PSC may be generated in the mode setting region or the auto refresh region. If control pulse PSC is at logic 'o' state, the transfer gate 1330b may be turned off, and thus the power-up signal VCCHB may not be transferred to the first node N1. If control pulse PSC is at logic '1' state, the transfer gate 1330b may be turned on, and thus the power-up signal VCCHB may be transferred to the first node N1.

If the power-up signal VCCHB is at logic '0' state, the voltage signal of the first node N1 may be at logic '0' state, the output voltage signal of the latch circuit 1360 may be at logic '1' state and the column reset signal RESC that is an output voltage signal of the third inverter 1370 may be at logic '0' state. The power-up signal VCCHB and the column reset signal RESC may be enabled at logic '0' state, respectively. The PMOS transistor 1350 may be turned off when the power-up signal VCCHB is at logic '0' state and turned on when the power-up signal VCCHB is at logic '1' state. If The PMOS transistor 1350 is turned on, the reference voltage VREF1 may be supplied to the first node N1, and thus a voltage of the first node N1 may increase. The second inverter 1340 and the PMOS transistor 1350 may decrease a transition time of the voltage signal when the voltage signal of the first node N1 transitions from logic '0' state to logic '1' state.

Figure 10:
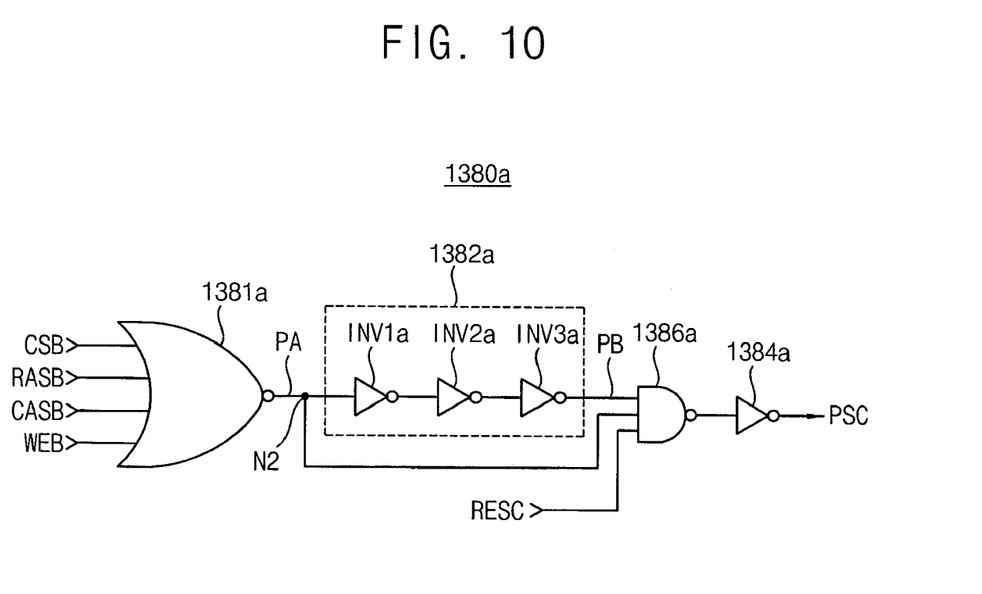
FIG. 10 is a circuit diagram illustrating an example of a pulse generator included in the reset signal generating circuit of FIG. 9.

FIG. 10 is a circuit diagram illustrating an example of the pulse generator 1380 included in the reset signal generating circuit 1300b of FIG. 9.

Referring to FIG. 10, a pulse generator 1380a includes a NOR gate 1381a, a delay circuit 1382a, a NAND gate 1386a and a fourth inverter 1384a. The delay circuit 1382a may include three inverters INV1a, INV2a and INV3a.

The NOR gate 1381a performs a NOR operation on a chip selection signal CSB, a row address strobe signal RASB, a column address strobe signal CASB and a write enable signal WEB. The delay circuit 1382a delays a first output signal PA of the NOR gate 1381a. The NAND gate 1383a performs a NAND operation on a second output signal PB of the delay circuit 1382a, the first output signal PA of the NOR gate 1381a and a column reset signal RESC. The fourth inverter 1384a inverts a logic state of an output signal of the NAND gate 1383a to generate a control pulse PSC.

Figure 11:
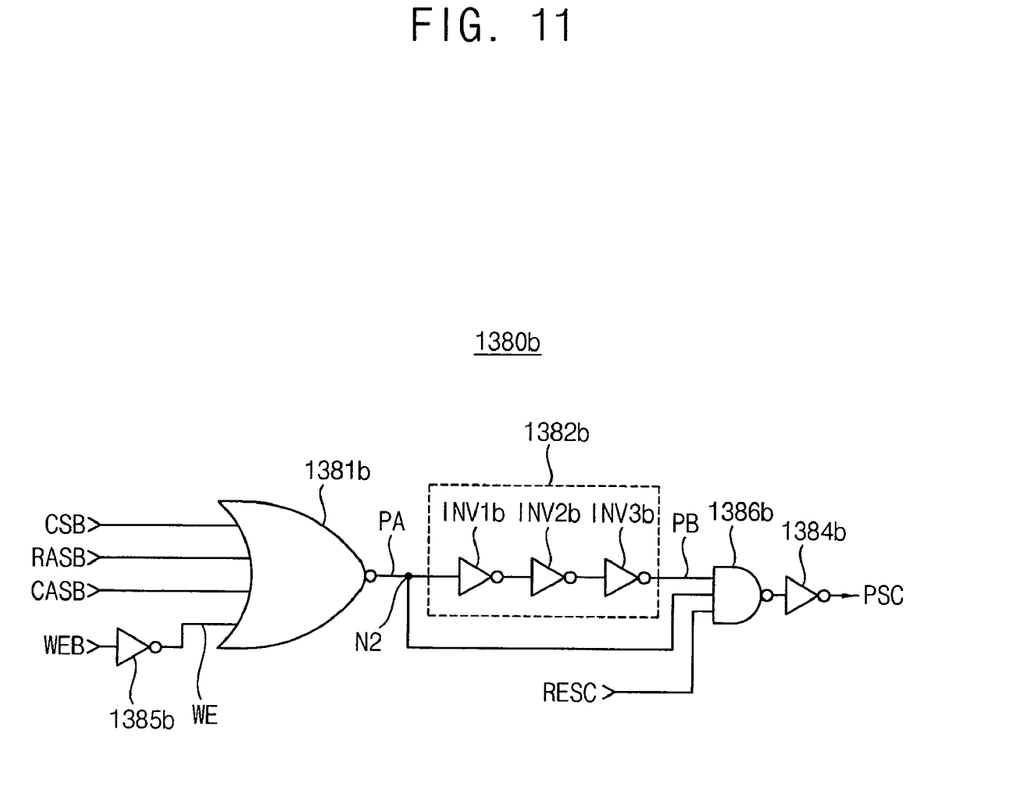
FIG. 11 is a circuit diagram illustrating another example of the pulse generator included in the reset signal generating circuit of FIG. 9.

FIG. 11 is a circuit diagram illustrating another example of the pulse generator 1380 included in the reset signal generating circuit 1300b of FIG. 9.

Referring to FIG. 11, a pulse generator 1380b includes a fifth inverter 1385b, a NOR gate 1381b, a delay circuit 1382b, a NAND gate 1386b and a fourth inverter 1384b. The delay circuit 1382b may include three inverters INV1b, INV2b and INV3b.

The fifth inverter 1385b inverts a logic state of a write enable signal WEB. The NOR gate 1381b performs a NOR operation on a chip selection signal CSB, a row address strobe signal RASB, a column address strobe signal CASB and an output signal of the fifth inverter 1385b. The delay circuit 1382b delays a first output signal PA of the NOR gate 1381b. The NAND gate 1383b performs a NAND operation on a second output signal PB of the delay circuit 1382b, the first output signal PA of the NOR gate 1381b and a column reset signal RESC. The fourth inverter 1384b inverts a logic state of an output signal of the NAND gate 1383b to generate a control pulse PSC.

The semiconductor memory device according to some example embodiments of the present invention initializes a row decoder in response to a power-up signal and a column decoder in response to a column reset signal that is enabled after the power-up signal is enabled. The semiconductor memory device according to some example embodiments of the present invention, can alternatively initialize a row path circuit including the row decoder in response to the power-up signal and a column path circuit including the column decoder in response to the column reset signal that is enabled after the power-up signal is enabled.

As mentioned above, the semiconductor memory device according to some example embodiments of the present invention may reduce a peak value of a surge current by initializing a row path circuit and a column path circuit at different time points. Therefore, the semiconductor memory device according to some example embodiments of the present invention can have a relatively short setup time of an internal power supply voltage when the semiconductor memory device is initialized.

While the example embodiments of the present invention and their advantages have been described in detail, it should be understood that various changes, substitutions and alterations may be made herein without departing from the scope of the invention.

What is claimed is:

1. A semiconductor memory device, comprising:
a row path circuit configured to decode a row address signal to provide a word line enable signal to a memory cell array, the row path circuit configured to be initialized in response to a power-up signal;
a reset signal generating circuit configured to delay the power-up signal to generate a column reset signal; and
a column path circuit configured to decode a column address signal to provide a column selection signal to the memory cell array, the column path circuit configured to be initialized in response to the column reset signal, wherein the reset signal generating circuit comprises:
a pulse generator configured to generate a control pulse in response to a command signal; and
a switching circuit configured to transfer the power-up signal to a first node in response to the control pulse.

2. The semiconductor memory device of claim 1, wherein the row path circuit and the column path circuit are initialized at different time points.

3. The semiconductor memory device of claim 2, wherein the row path circuit is initialized in a power-up region and the column path circuit is initialized in a mode setting region of the device.

4. The semiconductor memory device of claim 2, wherein the row path circuit is initialized in a power-up region and the column path circuit is initialized in an auto refresh region of the device.

5. The semiconductor memory device of claim 1, wherein the reset signal generating circuit further comprises:
an inverter configured to invert the power-up signal; and
a transistor configured to provide a reference voltage to the first node in response to an output signal of the inverter.

6. The semiconductor memory device of claim 5, wherein the reset signal generating circuit further comprises a latch circuit configured to latch a voltage signal of the first node to output the column reset signal.

7. The semiconductor memory device of claim 1, wherein the pulse generator comprises:
a NOR logic unit configured to perform an NOR operation on the command signal, including a chip selection signal, a row address strobe signal, a column address strobe signal and a write enable signal;
a delay circuit configured to delay a first output signal of the NOR logic unit such that the control pulse has a pulse width corresponding to a delay time generated by the delay circuit; and
an AND logic unit configured to perform an AND operation on the first output signal and a second output signal of the delay circuit to output the control pulse.

8. The semiconductor memory device of claim 7, wherein the pulse generator is configured to generate the control pulse in a mode setting region of the device.

9. The semiconductor memory device of claim 7, wherein the pulse generator is configured to generate the control pulse when the chip selection signal, the row address strobe signal, the column address strobe signal and the write enable signal are enabled.

10. The semiconductor memory device of claim 1, wherein the pulse generator comprises:
an inverter configured to invert a write enable signal;
a NOR logic unit configured to perform an NOR operation on the command signal, including a chip selection signal, a row address strobe signal, a column address strobe signal and a first output signal of the inverter;
a delay circuit configured to delay a second output signal of the NOR logic unit such that the control pulse has a pulse width corresponding to a delay time generated by the delay circuit; and
an AND logic unit configured to perform an AND operation on the second output signal and a third output signal of the delay circuit to output the control pulse.

11. The semiconductor memory device of claim 10, wherein the pulse generator is configured to generate the control pulse in an auto refresh region of the device.

12. The semiconductor memory device of claim 10, wherein the pulse generator is configured to generate the control pulse when the chip selection signal, the row address strobe signal and the column address strobe signal are enabled and the write enable signal is disabled.

13. A semiconductor memory device, comprising:
- a row path circuit configured to decode a row address signal to provide a word line enable signal to a memory cell array, the row path circuit configured to be initialized in response to a power-up signal;
- a reset signal generating circuit configured to delay the power-up signal to generate a column reset signal; and
- a column path circuit configured to decode a column address signal to provide a column selection signal to the memory cell array, the column path circuit configured to be initialized in response to the column reset signal, wherein the reset signal generating circuit comprises:
  - a switching circuit configured to transfer the power-up signal to a first node in response to a control pulse;
  - a latch circuit configured to latch a voltage signal of the first node;
  - a first inverter configured to invert an output signal of the latch circuit to output the column reset signal; and
  - a pulse generator configured to generate the control pulse in response to a command signal and the column reset signal.

14. The semiconductor memory device of claim 13, wherein the reset signal generating circuit further comprises:
- an inverter configured to invert the power-up signal; and
- a transistor configured to provide a reference voltage to the first node in response to an output signal of the inverter.

15. The semiconductor memory device of claim 13, wherein the pulse generator comprises:
- a NOR logic unit configured to perform an NOR operation on the command signal, including a chip selection signal, a row address strobe signal, a column address strobe signal and a write enable signal;
- a delay circuit configured to delay a first output signal of the NOR logic unit such that the control pulse has a pulse width corresponding to a delay time generated by the delay circuit; and
- an AND logic unit configured to perform an AND operation on the first output signal and a second output signal of the delay circuit to output the control pulse.

16. The semiconductor memory device of claim 15, wherein the pulse generator is configured to generate the control pulse in a mode setting region of the device.

17. The semiconductor memory device of claim 15, wherein the pulse generator is configured to generate the control pulse when the chip selection signal, the row address strobe signal, the column address strobe signal and the write enable signal are enabled.

18. The semiconductor memory device of claim 13, wherein the pulse generator comprises:
- an inverter configured to invert a write enable signal;
- a NOR logic unit configured to perform an NOR operation on the command signal, including a chip selection signal, a row address strobe signal, a column address strobe signal and a first output signal of the inverter;
- a delay circuit configured to delay a second output signal of the NOR logic unit such that the control pulse has a pulse width corresponding to a delay time generated by the delay circuit; and
- an AND logic unit configured to perform an AND operation on the second output signal and a third output signal of the delay circuit to output the control pulse.

19. The semiconductor memory device of claim 18, wherein the pulse generator is configured to generate the control pulse in an auto refresh region of the device.

20. The semiconductor memory device of claim 18, wherein the pulse generator is configured to generate the control pulse when the chip selection signal, the row address strobe signal and the column address strobe signal are enabled and the write enable signal is disabled.

21. The semiconductor memory device of claim 1, further comprising:
- an address input buffer configured to generate the row address signal and the column address signal in response to an external address signal; and
- a power-up circuit configured to generate the power-up signal based on an external power supply voltage.

22. The semiconductor memory device of claim 1, wherein the row path circuit includes a row decoder and the column path circuit includes a column decoder.

* * * * *